United States Patent [19]

Sunstein

[11] Patent Number: 4,473,263
[45] Date of Patent: Sep. 25, 1984

[54] CIRCUIT BOARD MOUNTING DEVICE AND ASSOCIATED COMPONENTS

[76] Inventor: Drew E. Sunstein, 310 Wheeler Rd., R.F.D. 6, Nashua, N.H. 03060

[21] Appl. No.: 226,924

[22] Filed: Jan. 21, 1981

[51] Int. Cl.³ .......................... H01R 9/09; H05K 1/14
[52] U.S. Cl. ................................ 339/17 LM; 361/415
[58] Field of Search ................................ 361/391–395, 361/399, 400, 412, 413, 415, 420; 339/17 M, 17 LM, 17 L, 17 LC, 17 R, 75 MP, 176 MP, 4; 211/41

[56] References Cited

U.S. PATENT DOCUMENTS

| | | | |
|---|---|---|---|
| 2,958,013 | 10/1960 | Ansley | 361/395 |
| 3,105,869 | 10/1963 | Branch et al. | 361/412 |
| 3,199,066 | 8/1965 | Eledge et al. | 339/176 MP |
| 3,563,391 | 2/1971 | Weltha | 211/41 |
| 3,627,140 | 12/1971 | Yanikoski | 361/415 |
| 3,993,383 | 11/1975 | Marino | 339/176 MP |
| 4,003,625 | 1/1977 | Vladic | 339/17 L |
| 4,084,874 | 4/1978 | Georgopulos | 339/75 MP |
| 4,304,966 | 12/1981 | Beirn et al. | 361/415 |
| 4,319,305 | 3/1982 | Meldrum | 361/415 |
| 4,426,675 | 1/1984 | Robinson et al. | 361/415 |

FOREIGN PATENT DOCUMENTS

| | | | |
|---|---|---|---|
| 2235920 | 3/1974 | Fed. Rep. of Germany | 339/176 MP |
| 2500733 | 7/1975 | Fed. Rep. of Germany | 339/125 R |

OTHER PUBLICATIONS

IBM Bulletin, Gillett, vol. 16, No. 6, pp. 1733–1734, 11-1973.

Primary Examiner—Neil Abrams
Attorney, Agent, or Firm—Bromberg, Sunstein & McGregor

[57] ABSTRACT

For mounting a plurality of circuit boards each having a connecting edge with conductors adjacent thereto, one structure is provided for holding the boards parallel and a related structure for causing the boards' connecting edges to be in proximity to connectors on a mother board, with each board disposed at an oblique angle to the mother board. A preferred embodiment of the mounting device is disclosed in which the boards are plugged into a mother board having angled connectors for receiving the boards at a 45 degree angle with respect to the mother board.

4 Claims, 7 Drawing Figures

CIRCUIT BOARD MOUNTING DEVICE AND ASSOCIATED COMPONENTS

DESCRIPTION

1. Technical Field

The present invention relates to devices, which are sometimes called "cages", for mounting circuit boards, and particularly to circuit board mounting devices of the type that mount a plurality of circuit boards that are plugged into a connecting board (sometimes called a "mother" board), which is also mounted on such devices.

2. Background Art

Circuit board mounting devices are well-known in the art. Typically, the connecting or "mother" board is mounted at right angles to a plurality of parallel mounted circuit boards that plug into the mother board. In consequence of the geometrical arrangement, prior art mounting devices typically have dimensions that are dictated directly by the size of the circuit boards in use. In particular, the height and depth of the mounting devices reflect the need to accommodate the related dimensions of the plug-in circuit board. That is, if the plug-in circuit board is understood as having its biggest dimensions as length and width, the length of the circuit board is reflected in the depth of the mounting device and the width of the circuit board is reflectd in the height of the device, since the plug-in circuit board is mounted on end. The very back of the device has a location for the mother board, so the depth of the device is increased to provide not only for the length of the plug-in circuit board but also for the depth of the mother board. The spacing between adjacent plug-in circuit boards in prior art devices must be sufficient to accommodate their "height." The height of circuit boards is generally the result of components mounted on them.

Also as a consequence of the geometry of prior art mounting devices, the circuit boards as plugged into the mother board are relatively inaccessible. It is difficult to see components that are mounted on a plug-in board, and it is difficult to make connections to the board even at the end opposite to that which is plugged into the mother board. In many prior art cases, access is best had to a plug-in circuit board by first unplugging it from the mother board, then making the connections or adjustments required, and, finally, plugging the board back in. In some cases, of course, it is preferable to have access to the circuit board without first having to unplug it. Because most circuit board mounting devices are rectangular parallelepipeds, and because the geometric arrangement of the mother board and plug-in circuit boards is also rectilinear, spaces inside the mounting devices that are available for other components tend to be rectangular parallelepipeds.

DISCLOSURE OF INVENTION

It is an object of the present invention to provide a novel circuit board mounting device.

It is also an object of the present invention to provide a circuit board mounting device having a depth that may be less than the length of plug-in circuit boards that the device is designed to mount.

Another object of the present invention is to provide a device for mounting circuit boards in such fashion that there may be both ready visibility of and physical access to a portion of each circuit board even while it is operatively plugged into a mother board in the device.

Another object of the present invention is to provide a device for mounting plug-in circuit boards at an oblique angle with respect to the mother board.

A further object of the present invention is to provide a novel connector, for mounting on a mother board, that permits plug-in boards to be connected to the mother board at an oblique angle.

A further object of the present invention is to provide a support wedge for converting a conventional connector into a novel connector of the type previously described.

These and other objects of the invention are achieved by providing, for circuit boards, each of which lies in a plane and has a connecting edge with conductors near such edge, a structure for holding the boards so that their planes are parallel and a related structure for causing the connecting edges of the boards to be in proximity to a connecting surface, wherein each board's plane is disposed at an oblique angle with respect to the connecting surface. In a preferred embodiment of the mounting device in accordance with the present invention, the boards are plugged into a mother board that has angled connectors for receiving the boards at a 45 degree angle with respect to the mother board. The invention also relates to a mother board and angled connector for use in the invention's mounting device.

BRIEF DESCRIPTION OF THE DRAWINGS

These and other objects and features of the invention will be more readily understood by consideration of the following detailed description taken with the accompanying drawings, in which.

DESCRIPTION OF SPECIFIC EMBODIMENTS

Figure 1A:
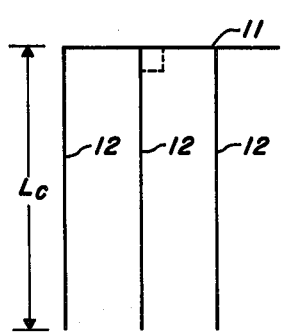
FIG. 1A is a simplified sketch of the configuration of a prior art mounting device.
Figure 1B:
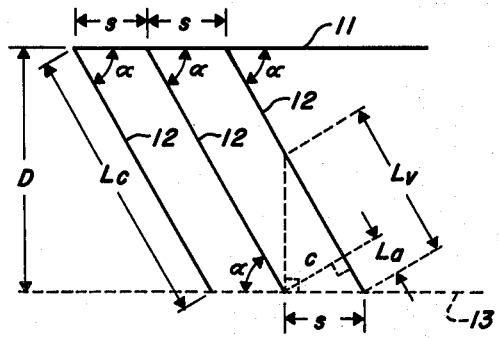
FIG. 1B is a simplified sketch of the configuration in accordance with an embodiment of the present invention.

Referring to FIGS. 1A and 1B, there are compared features of the present invention with the prior art.

FIGS. 1A and 1B both present the respective mounting devices in a simplified plan view. Thus the length $L_c$ of circuit board 12 becomes the depth of the device in FIG. 1A. Similarly, the width of the circuit board 12 becomes the height of the device. Typical prior art mounting devices include a mother board 11 shown in FIG. 1A, into which are plugged circuit boards 12. These circuit boards are configured so that their planes are at right angles to the planes of the mother board. (Throughout this description and the claims to the present invention, circuit boards are referred to as lying in a plane. It will be understood, however, that circuit boards invariably have a thickness, and invariably have components mounted on them, so that the notion of "plane" is only approximate. It is assumed, too, that the plane referred to will be located consistently in relation to each cirucit board, as, for example, in coincidence with the bottom surface of the phenolic or other material out of which the board is constructed.) In connection with FIG. 1A, it will be seen that the length $L_c$ of a circuit board 12 also gives rise to the depth of the entire configuration, assuming that the mother board has zero thickness.

Referring now to FIG. 1B, the circuit boards 12 are mounted an angle $\alpha$ with respect to the mother board 11. Each connection to the mother board is spaced a distance s from the preceding connection. In FIG. 1B, owing to the inclination of the circuit board 12 at angle $\alpha$ with respect to the mother board 11, the depth D of the device is less than the length $L_c$ of the circuit board 12. It will be apparent from an inspection of FIG. 1B that $$D/L_c = \sin \alpha$$

Thus, $$D = L_c \sin \alpha.$$

Accordingly, as $\alpha$ is made smaller, the depth D of the device is decreased.

Still in reference to FIG. 1B, the viewable length $L_v$ of the circuit board 12 is approximated with reference to a viewing plane 13 in front of the device and in contact with the nonconnected edges of the circuit boards 12. A perpendicular is erected from the plane 13 at a point where it is contacted by an adjacent circuit board. The length along the circuit board, from its nonconnected edge to the point where it is contacted by the perpendicular, is $L_v$. Since the spacing s between circuit boards is the same along plane 13 as it is along the mother board 11, we have $s/L_v = \cos \alpha$ or $L_v = s/\cos \alpha$. As $\alpha$ decreases, $L_v$ increases.

The spacing c between equivalent points on each board 12 is also determined to be $$c = s \sin \alpha.$$

In other words, although decreasing $\alpha$ has the advantage of increasing $L_v$, and, as shall be seen, increasing the accessible area $L_a$, it also decreases the board-to-board spacing c, thereby reducing the headroom, between adjacent boards, for filling boards with components. The point at which a vertical projection, from the tip of one board to an adjacent board, contacts the adjacent board is approximately at the maximum distance $L_a$ from the edge of a board with respect to which easy physical access can be had for adjustment or connection to the board. Again from FIG. 1B, we have $$L_a = s \cos \alpha,$$

so that decreasing $\alpha$ increases $L_a$.

In view of the desirability of keeping D relatively small, and making c, $L_a$ and $L_v$ relatively large, I have found it desirable in many cases to set $\alpha$ at 45 degrees. For example, if the length $L_c$ of a circuit board is approximately $6\frac{1}{2}$ inches and its width is $4\frac{1}{2}$ inches, the circuit boards can be accommodated in a mounting device having a depth D of approximately five inches and a height of five inches. If the width of the mounting device is then made approximately ten inches and given the overall shape of a rectangular parallelepiped, it can provide slots to mount six circuit boards having a spacing s of one inch between centers along the mother board. Such a spacing provides head-to-head clearance c between circuit board planes of approximately $\frac{3}{4}$ of an inch and an accessible length $L_a$ also of $\frac{3}{4}$ of an inch. The viewable length $L_v$ would be approximately $1\frac{3}{8}$ inches. These dimensions are a preferred set of dimensions for use in the preferred embodiment discussed below, although different-sized circuit boards and particular needs may dictate other preferred dimensions.

Figure 2:
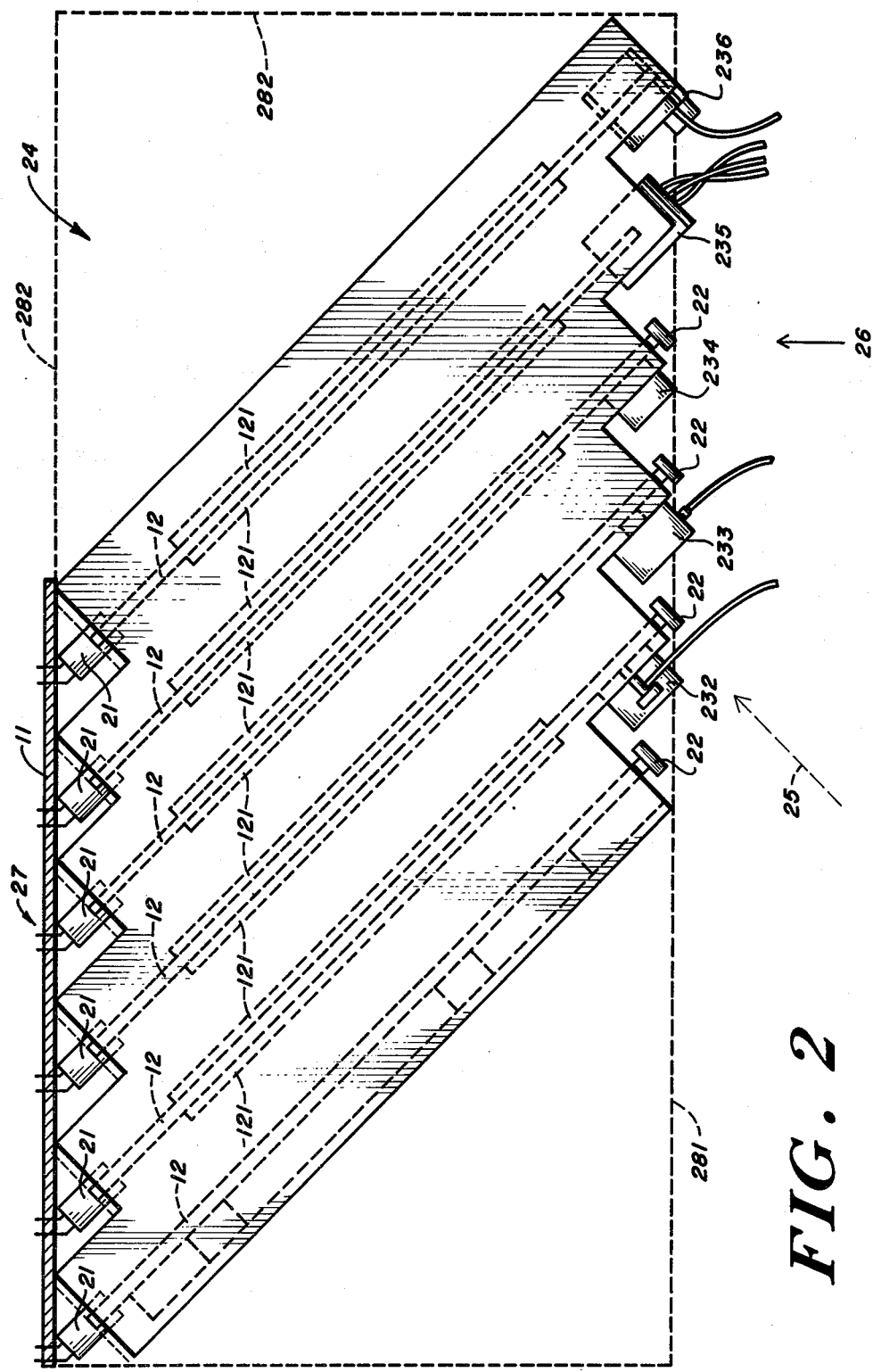
FIG. 2 is a top cut-away view of a preferred embodiment of a circuit board mounting device in accordance with the present invention.

Referring now to FIG. 2, there is shown a cut-away plan of a preferred embodiment of the mounting device. For purposes of this discussion, the front of the device is indicated by arrow 26 and the rear of the device is indicated by arrow 27. Access to the noninserted edges of the circuit boards is generally along the direction indicated by dashed arrow 25. Six circuit boards 12 are shown connected to a mother board 11. The number of circuit boards 12 actually employed is, of course, a matter of choice. The circuit boards 12 are connected through connectors 21 to the mother board 11. Guides 121 appear on top and bottom plates of the device to guide the circuit boards when they are slid into place. In the embodiment shown, the boards 12 are disconnected from connectors 21 by pulling at the angle $\alpha$ (which here is 45 degrees) with respect to the mother board, and the circuit board slides between the guides 121 out of the mounting device. A conventional card extractor 22 assists in removal of each board. The novel configuration of the present invention permits ready access to such elements as terminal strip 232, ribbon cable connector 233, display and adjustment items 234, edge connector 235 and right angle connector 236. One of the outermost circuit boards may contain an entire "front panel" array of displays, switches, and adjustments.

Still in reference to FIG. 2, the device, may have the general shape of a rectangular parallelepiped indicated by dashed lines 281 and solid line 282, or the shape may be modified so that the leftmost circuit board, for example, is at or near an outside surface of the device. If lines 282 indicate boundaries of the device, the interior space 24, which is triangular in cross section, can be used for items such as power supplies.

Figure 3:
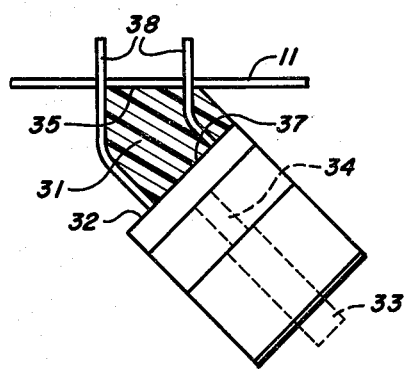
FIG. 3 is a preferred embodiment of an angled connector in accordance with the present invention.

A typical one of the connectors 21 illustrated in FIG. 2 is shown in further detail in FIG. 3. As illustrated, the plug-in boards themselves include conductors so that conventional edge connectors may be employed. In this instance, the edge connector on the mother board is, of course, a female connector, and each plug-in board's connecting edge is the equivalent of a male connector. As used in this description and the following claims, the term "connectors" includes this male connector equivalent, which results whenever the plug-in board is designed to mate with an edge connector. The invention may also be used with a variety of other types of connectors between the plug-in board and the mother board. For example, the plug-in board may have a female connector attached to it and the mother board a male that meets with the plug-in board connector. In each case, the connector on the mother board is arranged so that it mates with the appropriate connectors from the plug-in board when the plug-in board is slid in toward the mother board through the device at the oblique angle used in connection with the design of the mounting device. Thus the connector on the mother board, as mounted on the mother board, has an "access angle", for the corresponding plug-in board's connector, that is the same angle as the foregoing oblique angle. When the mother board's connector is approached by the corresponding plug-in board's connector at this "access angle," as that term is understood in this description and the following claims, the two connectors can be joined and electrical contact can be made between the two.

An angled connector for use in the present invention may be made from a conventional edge connector as illustrated in FIG. 3. The conventional connector has a, slot 33, a mounting hole 34, a contact surface 32 and leads 38. The conventional connector is put in contact with a support wedge 31 having a support surface 37 and a mounting surface 35, which is positioned in contact with the mother board 11 by leads 38. The angle between the support surface 37 and the mounting surface 35 is the complement of the angle with respect to which the circuit board meets the mother board. In some embodiments it may be possible to use a conventional connector having leads 38 bent in such a way that the proper angle is achieved without recourse to the use of the support wedge 31. In such an instance, it may be desirable that at least an edge of the conventional connector be in contact with the circuit board 11 for additional strength. Of course, a special angled connector could be made in a fashion analogous to that illustrated in FIG. 3, wherein, the conventional connector and the support wedge form an integral structure rather than two discrete structures. In such a case the angled connector has a mounting surface that is at an angle that is the complement of the access angle.

Figure 4:
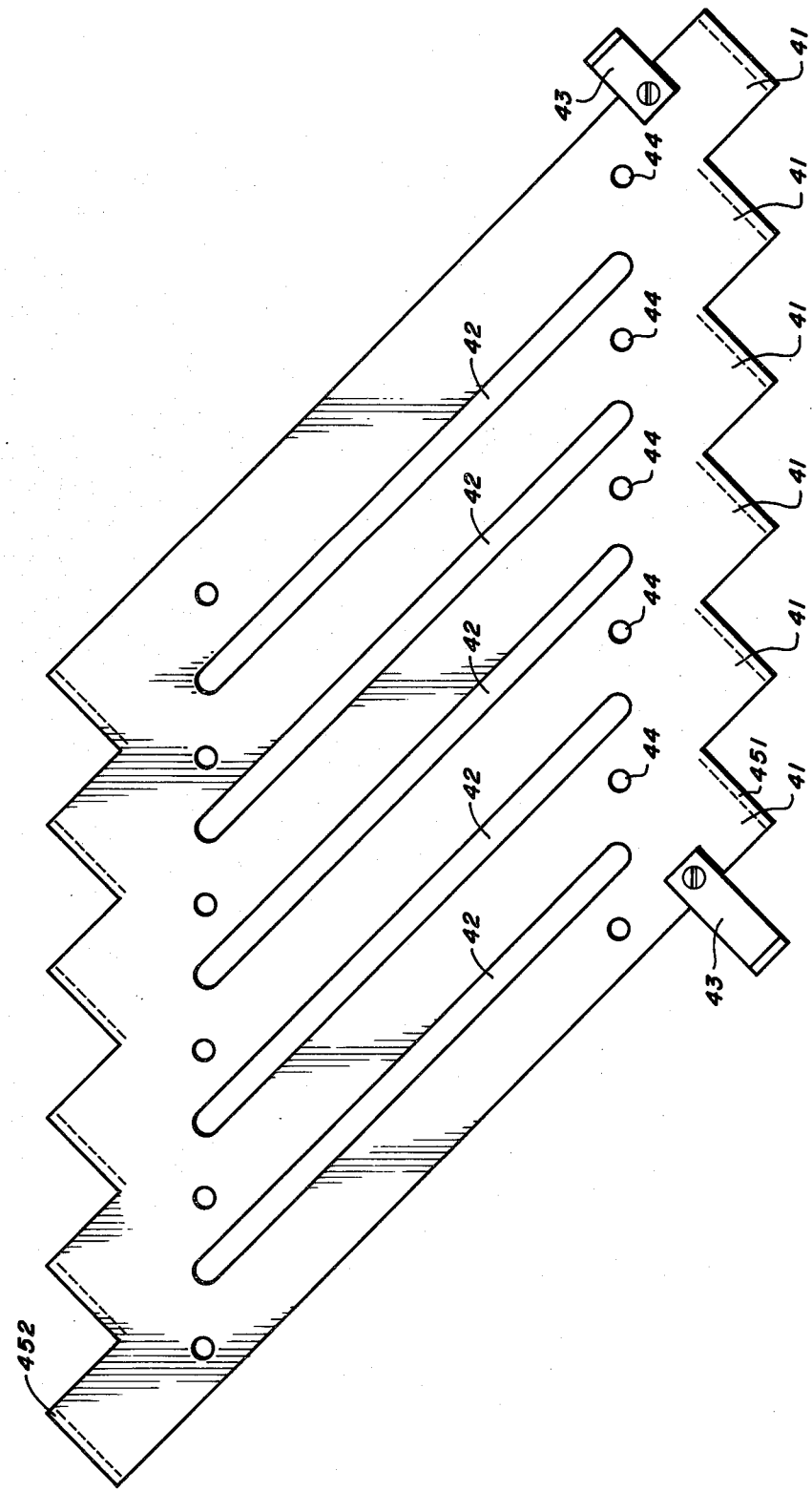
FIG. 4 is a plan view of a top plate for the device illustrated in FIG. 2.

FIG. 4 illustrates an appropriate top plate for use in the embodiment illustrated in FIG. 2. The plate includes five cooling slots 42 for convection cooling. The plate is held in position with respect to a lower plate by means of vertical support brackets 43. The plate provides a stepped location 41 for each of the six circuit boards accommodated by the mounting device. At each location 41 is provision 451 for giving the extractor a surface to push against. If the board is made of a thin metal plate, the surfaces 451 can be formed by bending of the plate. Similar provision is made at the rear of the plate, indicated by item 452, for mounting connectors. There are also provided holes 44 for mounting the guides 121 illustrated in FIG. 2. The mounting device uses a bottom plate that is virtually identical to the plate illustrated in FIG. 4, except that the bottom plate is a mirror image of the illustrated top plate.

Figure 5:
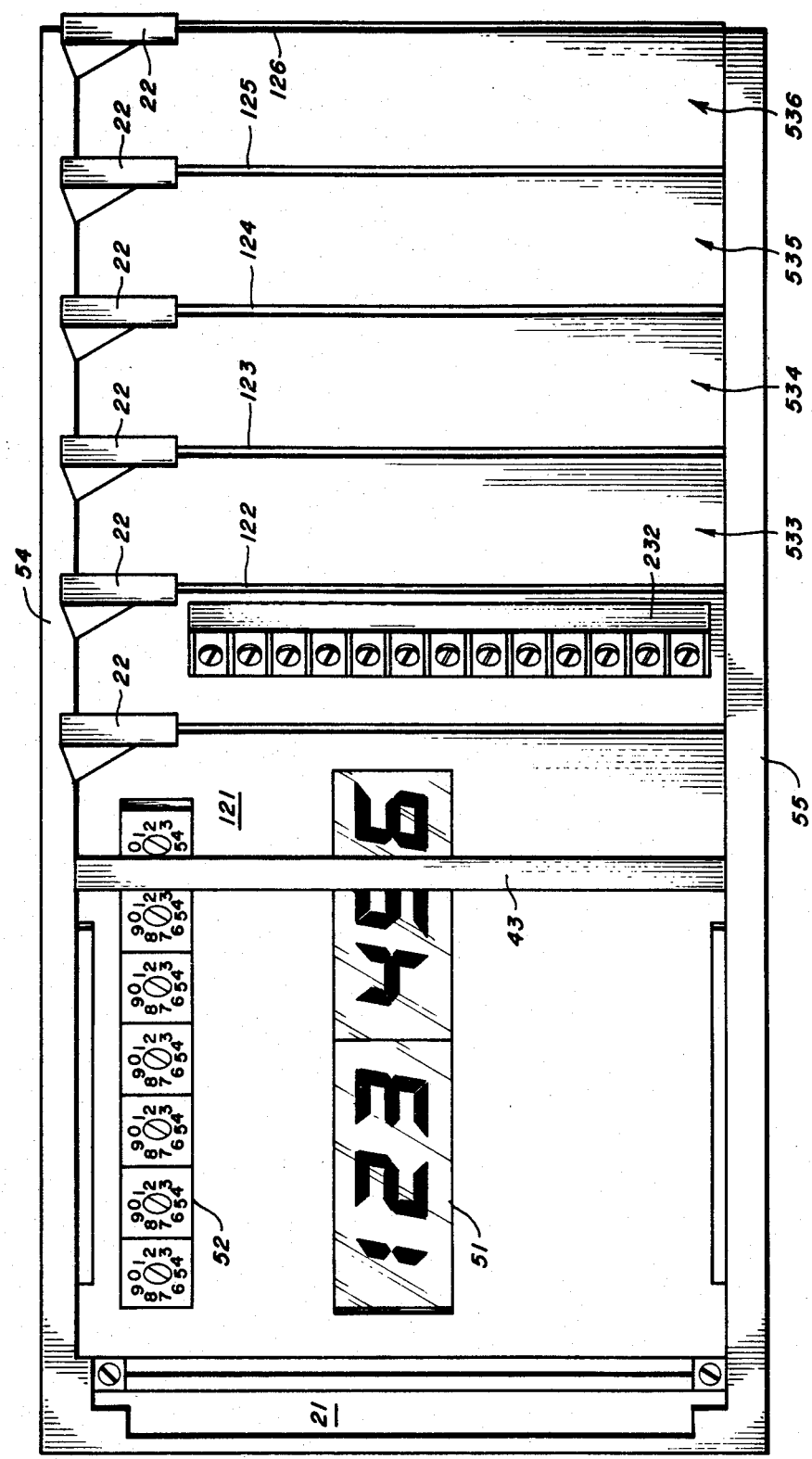
FIG. 5 is a front elevation of the device illustrated in FIG. 2.

FIG. 5 shows a front elevation of the embodiment illustrated in FIG. 2. The leftmost board in the device includes a display 51 as well as controls 52. The post 43 runs between the top plate 54 and the bottom plate 55. Each of the six circuit boards 121 through 126 includes an extractor 22. Although the leftmost circuit board 121 includes the entire face of the board for access, nevertheless, each of the other circuit boards 122 through 126 provides substantial access for items such as terminal strip 232 or spaces 533 through 536 for connectors, connection, display, and adjustment.

Figure 6:
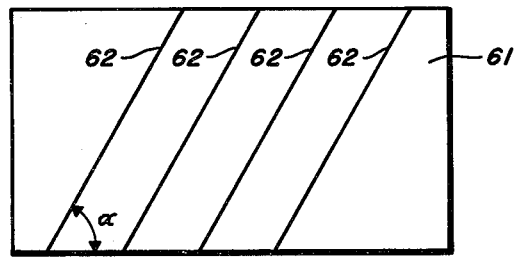
FIG. 6 is a schematic illustration of another embodiment of the invention that may be preferred in some instances.

Some benefits of the above embodiment of the present invention may also be realized if the planes of the plug-in circuit boards are maintained perpendicular to the mother board, parallel to each other, but skewed from the vertical, for example, at a 45 degree angle. This embodiment is illustrated schematically in FIG. 6. The mother board 61 is shown in a vertical orientation, i.e. standing on edge, its plane lying parallel to the page.

The plug-in boards 62 are shown in edge view, plugged into the mother board. The plane of each plug-in board 62 is at an oblique angle α with repsect to the vertical, even though each plug-in board's plane is also perpendicular to the plane of the mother board 61. (Of course, the reference to the term "vertical" here and in the claims is arbitrary, so long as the described relationship between the mother board and the plug-in boards is maintained.) Access can be had in a fashion analagous to that previously discussed, along the top or bottom of the array, as well as from the front. A disadvantage of this arrangement, however, is that the guides for the circuit boards and related structural items could interfere somewhat with access. In certain instances space design criteria may dictate that this is a preferred embodiment of the invention.

Accordingly, while the invention has been described with particular reference to specific embodiments thereof, it will be understood that it may be embodied in a variety of forms diverse from those shown and described without departing from the spirit and scope of the invention as defined by the following claims.

What is claimed is:

1. A device for a mounting on a mother board to receive and establish electrical connection with a circuit board, including a conventional connector of the type having a longitudinal axis, a contact surface for mounting against the mother board and defining a plane parallel to the mother board, and a connecting face having a slot therein for receiving the circuit board, such slot defining a plane parallel to the longitudinal axis and perpendicular to the contact surface, the connector further having means, including electrical conductors passing through the contact surface and attaching to the mother board, for establishing electrical connection between the mother board and the circuit board, such device comprising:

a support wedge, having (1) a support surface, in contact with the contact surface of the conventional connector, and (2) a mounting surface disposed at an oblique angle with respect to its support surface, the wedge having one or more channels extending from its support surface to its mounting surface for passage of the electrical conductors of the conventional connector therethrough so that when the electrical conductors are attached to the mother board the wedge holds the connector in a fixed oblique dihedral angle with respect to the mother board.

2. An angled connector according to claim 1, wherein the angle formed by the plane of the mounting surface and plane of the slot is approximately 45°.

3. A device for simultaneously mounting a plurality of circuit boards in spaced apart, parallel relation to each other and in electrical connection with a mother board, the mother board having an array of connectors for slideably electrically engaging the circuit boards, such device comprising:

a receptacle-like circuit board card cage for receiving a plurality of inserted circuit boards, said cage having front and rear regions, a mother board rigidly affixed at said rear region, said mother board being a printed circuit board, insulative connector housings rigidly affixed on said mother board, each of said housings containing contacts within a slot in the housing oriented to slideably receive a circuit board, the contacts engaging conductive paths on said mother board, said card cage having guide means for guiding side edges of said inserted circuit boards from a card cage entrance at said front region to a position with which leading edges of said inserted boards are received in said connector housings and electrically engage said contacts wherein the device is characterized in that the slots of the connector housings are at a fixed oblique dihedral angle with respect to the mother board, and the guide means are oriented at the same dihedral angle so as to guide the circuit boards into the slots.

4. A device according to claim 3, wherein the oblique angle is approximately 45°.

* * * * *